(12) United States Patent
Lee

(10) Patent No.: US 10,658,064 B2
(45) Date of Patent: May 19, 2020

(54) MEMORY DEVICE AND TEST METHOD THEREOF

(71) Applicant: SK hynix Inc., Gyeonggi-do (KR)

(72) Inventor: Jeong-Jun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 139 days.

(21) Appl. No.: 15/794,142

(22) Filed: Oct. 26, 2017

(65) Prior Publication Data

US 2018/0268917 A1    Sep. 20, 2018

(30) Foreign Application Priority Data

Mar. 17, 2017 (KR) .................. 10-2017-0033562

(51) Int. Cl.
| | | |
|---|---|---|
| G11C 29/00 | (2006.01) | |
| G11C 29/42 | (2006.01) | |
| G11C 29/30 | (2006.01) | |
| G11C 29/36 | (2006.01) | |

(52) U.S. Cl.
CPC .............. G11C 29/42 (2013.01); G11C 29/30 (2013.01); G11C 29/36 (2013.01)

(58) Field of Classification Search
None
See application file for complete search history.

(56) References Cited

U.S. PATENT DOCUMENTS

| | | | | |
|---|---|---|---|---|
| 5,835,952 A | * | 11/1998 | Yamauchi ........... | G06F 12/0607 711/157 |
| 6,262,924 B1 | * | 7/2001 | Fukutani .................. | G11C 8/18 365/200 |
| 2010/0235695 A1 | * | 9/2010 | Lee ...................... | G06F 11/1048 714/719 |
| 2011/0258515 A1 | * | 10/2011 | Earle .................... | G06F 11/1048 714/763 |
| 2014/0169114 A1 | * | 6/2014 | Oh ..................... | G11C 11/40611 365/222 |
| 2015/0067448 A1 | * | 3/2015 | Son ........................ | G11C 29/52 714/773 |

FOREIGN PATENT DOCUMENTS

KR    1020080007806    1/2008

OTHER PUBLICATIONS

Ashok K. Sharma, "Memory Design for Testability and Fault Tolerance," in Semiconductor Memories: Technology, Testing, and Reliability ,, IEEE, 1997, (Year: 1997).*

* cited by examiner

Primary Examiner — Daniel F. McMahon
(74) Attorney, Agent, or Firm — IP & T Group LLP

(57) ABSTRACT

A test method for a memory device which includes performing a first write operation of writing test data to first regions of a normal cell region and a parity cell region, and storing a parity bit generated based on the test data in a temporary storage circuit, performing a second write operation of writing the parity bit stored in the temporary storage circuit to a second region of the parity cell region, performing a first read operation of reading the parity bit from the second region of the parity cell region, and storing the parity bit into the temporary storage circuit, and performing a second read operation of reading the test data from the first regions of the normal cell region and the parity cell region, correcting an error of the test data using the parity bit stored in the temporary storage circuit, and outputting error-corrected test data.

20 Claims, 15 Drawing Sheets

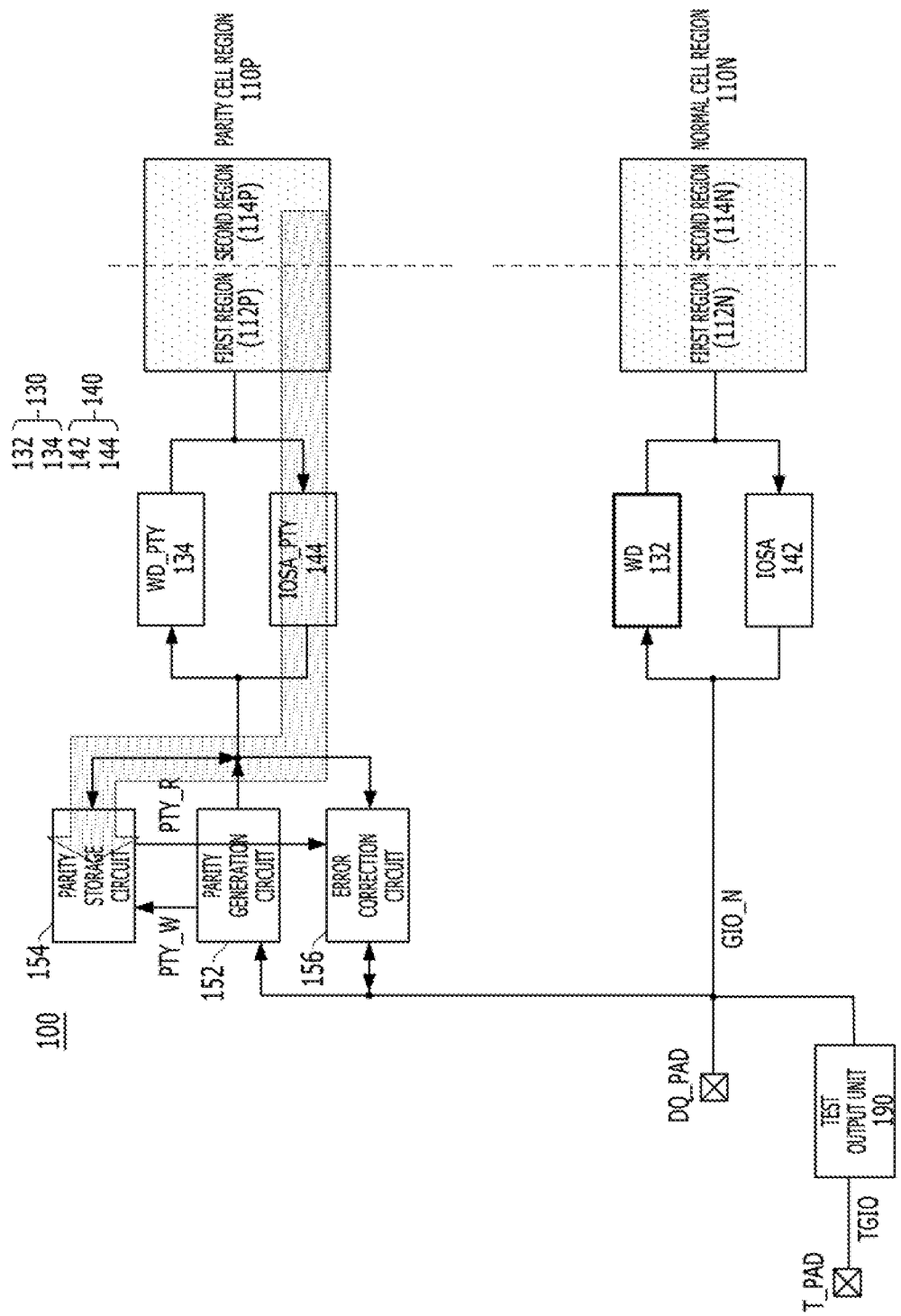

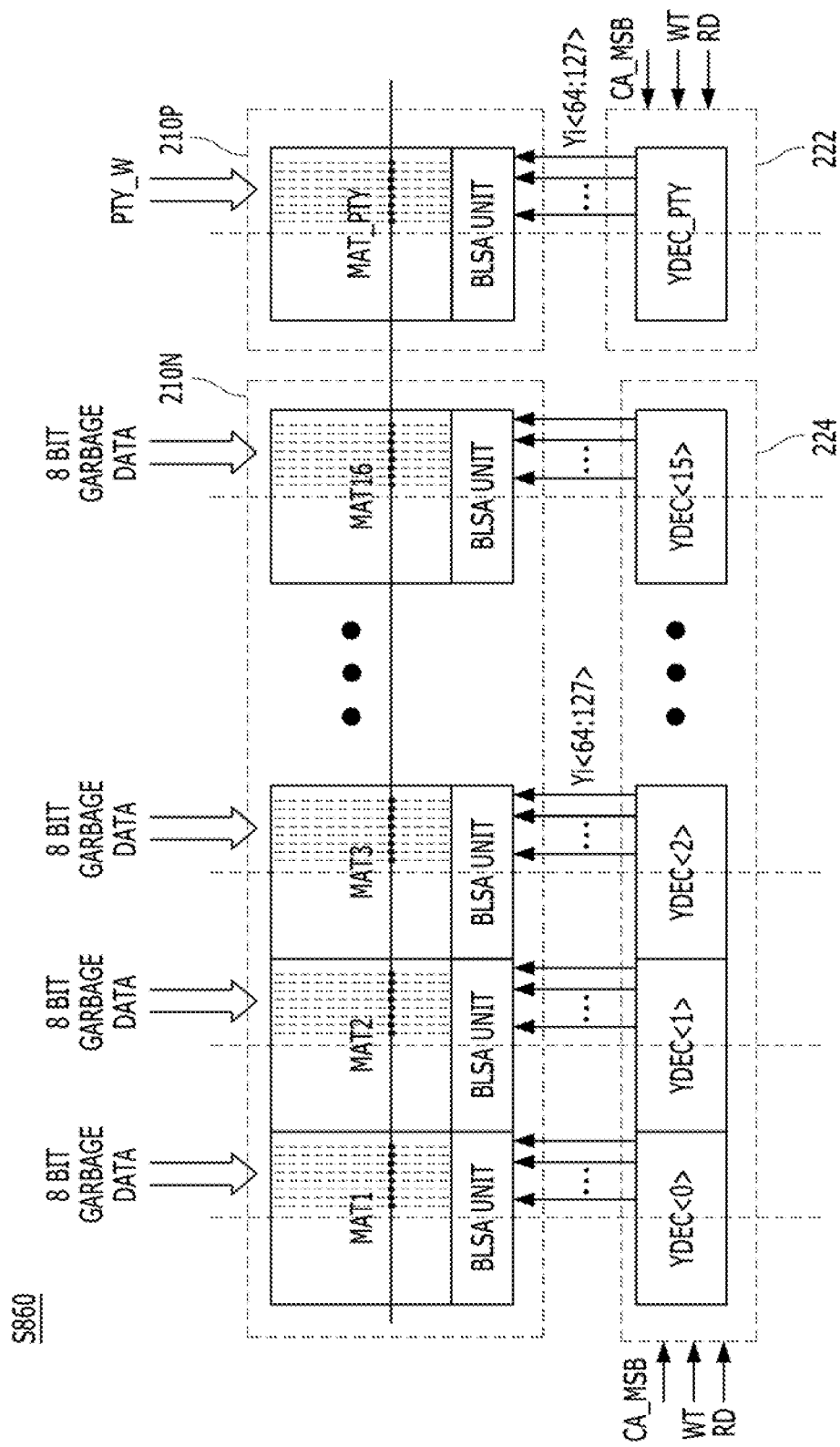

MEMORY DEVICE AND TEST METHOD THEREOF

CROSS-REFERENCE TO RELATED APPLICATIONS

The present application claims priority of Korean Patent Application No. 10-2017-0033562, filed on Mar. 17, 2017, which is herein incorporated by reference in its entirety.

BACKGROUND

1. Field

This patent document relates to a semiconductor design technology, and more particularly, to a test method of a memory device having an on-chip error correction code (ECC) scheme.

2. Description of the Related Art

As memory devices shrink in size, fail data randomly occurs which increases soft errors. Therefore, in order to address such a concern, an on-chip ECC scheme has been recently employed by mounting an ECC function in a memory device. That is, a memory device may perform a repair operation of replacing repair target memory cells with redundancy memory cells or may correct an error thereof based on the on-chip ECC scheme.

To implement the on-chip ECC scheme, a parity bit for ECC may be allocated and stored into a specific space. In particular, a memory device employing the on-chip ECC scheme may allocate and store a parity bit for ECC into memory cells included in a memory array region. Hereafter, the memory cells for storing the parity bit for ECC will be referred to as 'ECC memory cells'.

In general, after all fabrication processes are completed, a test is performed on memory devices to measure various characteristics of the memory devices formed on a semiconductor substrate. Such a test can detect a defect in processes such as the fabrication process and assembly process of the semiconductor substrate, thereby increasing the throughput of the memory devices.

In particular, a wafer test of testing a memory device at the wafer level includes a parallel bit test (PBT) for reducing the test time. The PBT may include writing specific test data to all memory cells, and determining a pass/fail by comparing the specific test data with the written test data outputted through a global data line from the memory cells.

However, in a memory device employing the on-chip ECC scheme, parity bits for correcting errors of normal cells are written to ECC memory cells. Thus, the memory device cannot be tested through the PBT that writes the same test data to normal cells and ECC memory cells, reads the written test data, and compares the read test data with the original test data.

Therefore, research needs to be conducted on a method capable of efficiently performing a parallel test on a normal cell region for storing normal cells and a parity cell region for storing ECC memory cells.

SUMMARY

Various embodiments are directed to a method capable of testing a memory device employing an on-chip ECC scheme in parallel.

In an embodiment, a test method of a memory device may include: performing a first write operation of writing test data to first regions of a normal cell region and a parity cell region, and storing a parity bit generated based on the test data in a temporary storage circuit; performing a second write operation of writing the parity bit stored in the temporary storage circuit to a second region of the parity cell region; performing a first read operation of reading the parity bit from the second region of the parity cell region, and storing the parity bit into the temporary storage circuit; and performing a second read operation of reading the test data from the first regions of the normal cell region and the parity cell region, correcting an error of the test data using the parity bit stored in the temporary storage circuit, and outputting error-corrected test data.

In an embodiment, a memory device may include: a normal cell region and a parity cell region; a parity storage circuit suitable for temporarily storing a write parity bit generated based on test data and a read parity bit outputted from the parity cell region; a write circuit suitable for writing the test data to first regions of the normal cell region and the parity cell region, and writing the write parity bit stored in the parity storage circuit to a second region of the parity cell region; a read circuit suitable for reading the read parity bit from the second region of the parity cell region, and reading the test data from the first regions of the normal cell region and the parity cell region; and an error correction circuit suitable for correcting an error of the test data read from the first regions using the read parity bit stored in the parity storage circuit.

In an embodiment, a memory device may include: a normal cell region and a parity cell region; an additional command generator suitable for generating an internal read command or an internal write command which is activated at a predetermined time after a read command or a write command is inputted; a parity generation circuit suitable for generating a parity bit for test data in response to the write command; a parity storage circuit suitable for storing the parity bit in response to the read command or the write command, and outputting the stored parity bit in response to the internal read command or the internal write command; a write circuit suitable for writing the test data to first regions of the normal cell region and the parity cell region according to the write command, and writing the parity bit stored in the parity storage circuit to a second region of the parity cell region according to the internal write command; a read circuit suitable for reading the parity bit from the second region of the parity cell region according to the read command, and reading the test data from the first regions of the normal cell region and the parity cell region according to the internal read command; and an error correction circuit suitable for correcting an error of the test data read from the first regions using the parity bit stored in the parity storage circuit.

BRIEF DESCRIPTION OF THE DRAWINGS

FIGS. 3A to 3D are diagrams for describing a test operation of the memory device shown in FIG. 2.

FIGS. 8A and 8B are diagrams describing the steps shown in FIG. 7.

DETAILED DESCRIPTION

Figure 1:
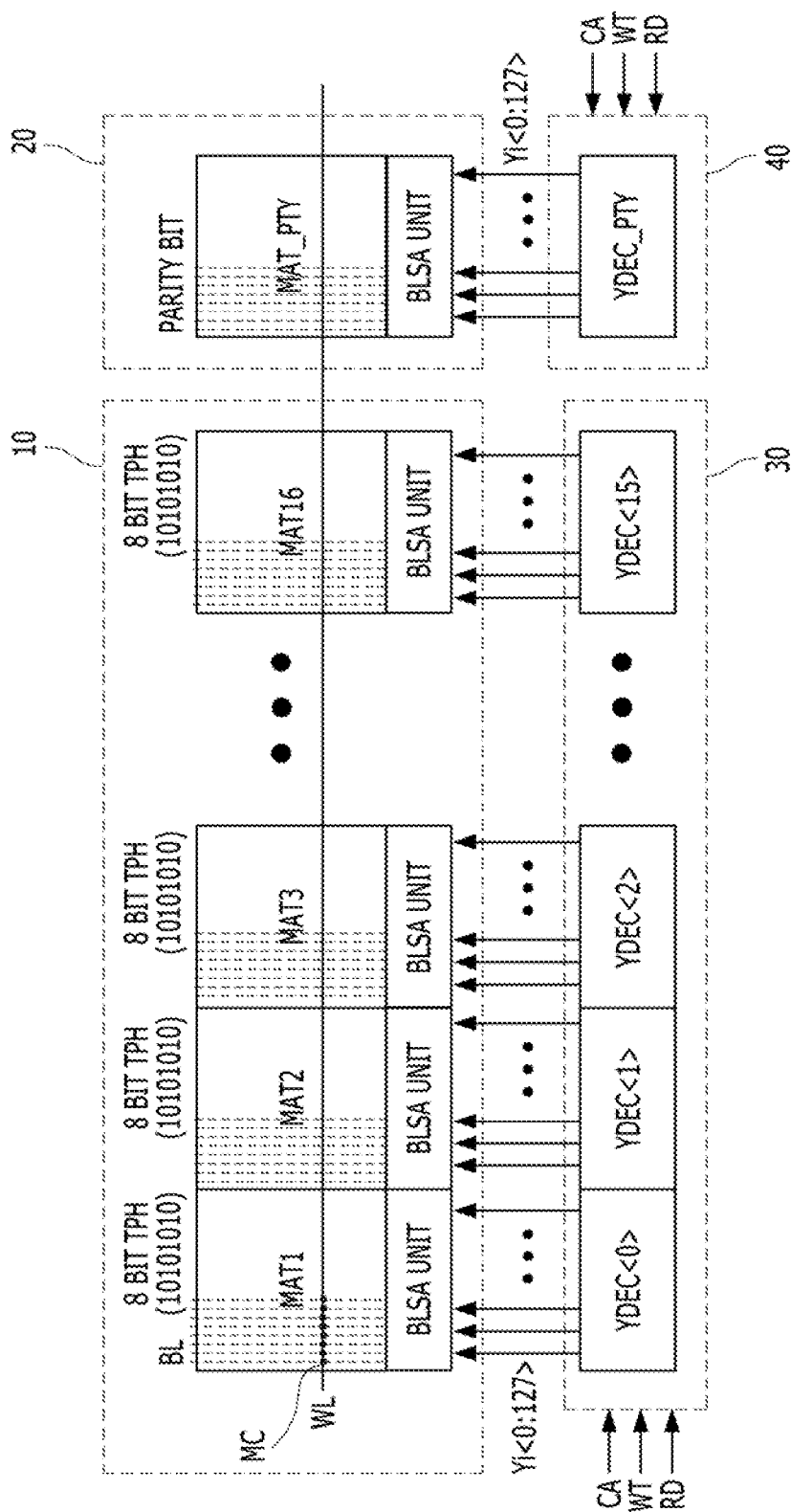
FIG. 1 is a diagram for describing a parallel bit test (PBT) of a memory device employing the on-chip ECC scheme.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a diagram for describing a parallel bit test (PBT) of a memory device employing an on-chip ECC scheme. For convenience of description, FIG. 1 mainly illustrates column-based components.

Referring to FIG. 1, the memory device may include a normal cell region 10 and a parity cell region 20. The normal cell region 10 may store normal data, and the parity cell region 20 may store parity bits for correcting errors in the normal data. In the normal cell region 10 and the parity cell region 20, bit line sense amplifier (BLSA) units corresponding to cells mats, respectively, may be arranged. As an example, the normal cell region 10 includes 16 cell matrixes (referred as mats) MAT1 to MAT16, and the parity cell region 20 includes one cell mat MAT_PTY.

The memory device may further include a plurality of normal column decoders 30 and a parity column decoder 40. The plurality of normal column decoders 30 may include 16 column decoders YDEC<0:15> corresponding to the 16 cell mats MAT1 to MAT16, respectively, and the parity column decoder 50 may include one column decoder YDEC_PTY corresponding to the cell mat MAT_PTY.

When a write command WT or a read command RD is activated, the plurality of normal column decoders YDEC<0:15> and the parity column decoder YDEC_PTY may activate one of 128 column select signals Yi<0:127> by decoding a column address CA. Each of the BLSA units may sense and amplify data loaded on a bit line BL, according to the activated column select signal Yi<X> where X is an integer between 0 and 127. At this time, according to one column select signal Yi<X>, a plurality of bit lines BL or memory cells MC may be selected. For example eight bit lines BL may be selected.

During a test mode, when the write command WT is inputted, a word line WL of all the cell mats MAT1 to MAT16 and MAT_PTY, corresponding to a row address, may be enabled and the column select signal Yi<X> corresponding to the column address CA may be activated. Therefore, in each of the cell mats, eight memory cells MC may be selected, the eight memory cells MC being coupled between the enabled word line WL and the selected bit lines BL selected according to the activated column select signal Yi<X>. At this time, since an 8-bit test pattern TPH (Test Pattern Hold) of "10101010", for example, is written to each of the 16 cell mats MAT1 to MAT16 of the normal cell region 10, a test pattern having a total of 128 bits (=8*16) may be written to the normal cell region 10 according to one column select signal Yi<X>. Furthermore, an 8-bit parity bit for correcting an error of the 128-bit test pattern may be written to the cell mat MAT_PTY of the parity cell region 20.

When the read command RD is inputted, a word line WL of all the cell mats MAT1 to MAT16 and MAT_PTY, corresponding to a row address, may be enabled and the column select signal Yi<X> corresponding to the column address CA may be activated. Therefore, in each of the cell mats, eight memory cells MC coupled between the enabled word line WL and the selected bit lines BL may be selected. The memory device may correct an error of the 128-bit test pattern read from the normal cell region 10 using the parity bit read from the parity cell region 20, compare the error-corrected test pattern with a target test pattern of "10101010", and output a 1-bit test result signal indicating a pass/fail.

During the PBT, the memory device may write a specific test pattern to the normal cell region 10, read the written test pattern, correct an error of the read test pattern using the parity bit read from the parity cell region 20, compare the error-corrected test pattern with a target test pattern, and determine whether the memory device is normal, depending on the comparison result.

In the memory device employing the on-chip ECC scheme, however, since parity bits for correcting errors of normal cells may be written to the parity cell region 20, the memory device cannot be tested through the PBT that writes the same test pattern to normal cells and ECC memory cells, reads the write test pattern, and compares the read test pattern with the target test data.

Hereafter, a method for testing a cell region for storing ECC parity bits and a normal cell region for storing normal data in parallel in a memory device employing the on-chip ECC scheme will be described.

The following descriptions will be focused on the components for performing data input/output, that is, the column-based components. Furthermore, a test mode may include a PBT mode.

Figure 2:
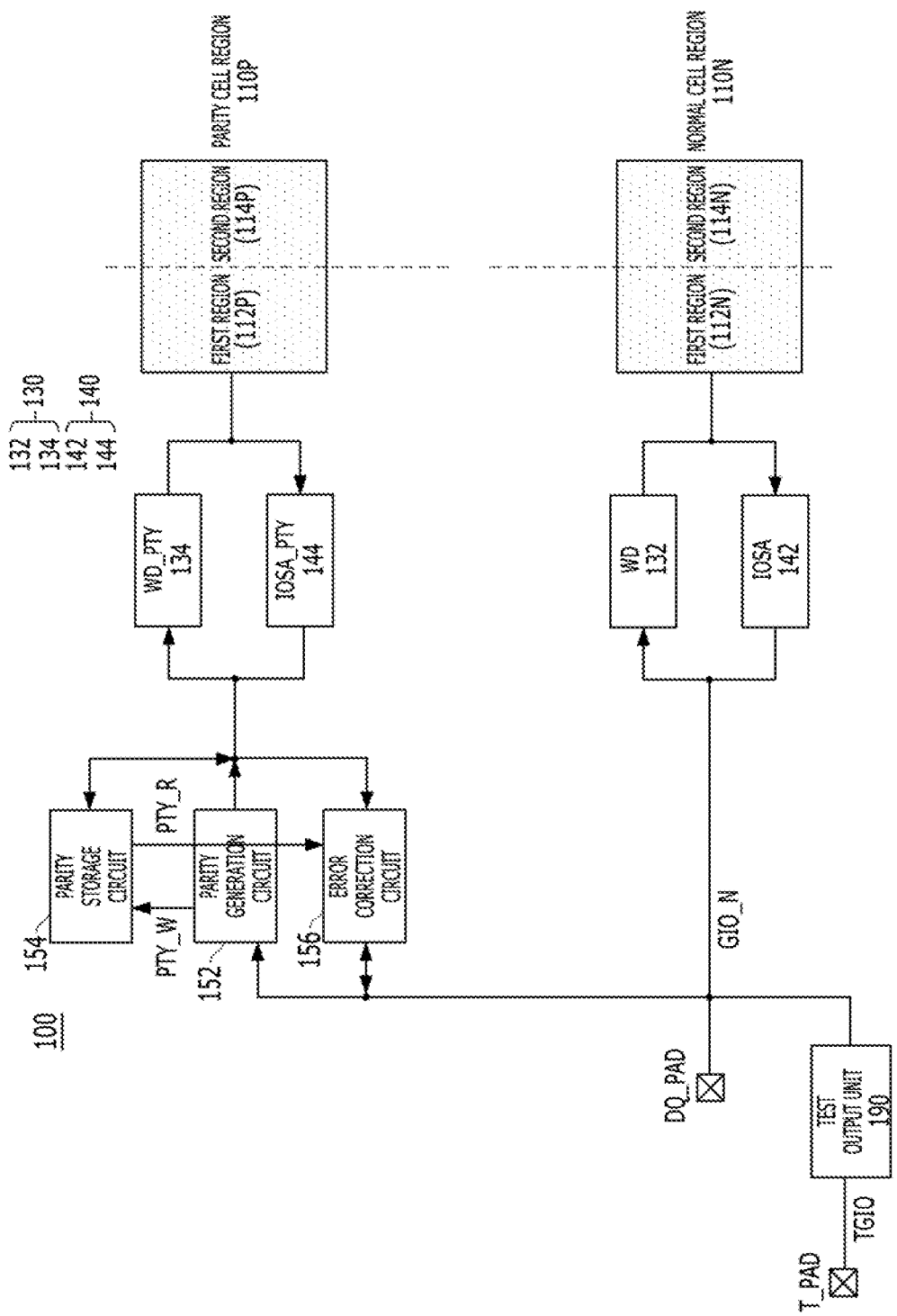
FIG. 2 is a block diagram illustrating a memory device in accordance with an embodiment of the present invention.

FIG. 2 is a block diagram illustrating a memory device 100 in accordance with an embodiment of the present invention. For the thorough description, the components for performing a test operation will be mainly described.

Referring to FIG. 2, the memory device 100 may include a normal cell region 110N, a parity cell region 110P, a write circuit 130, a read circuit 140, a parity generation circuit 152, a parity storage circuit 154, an error correction circuit 156, and a test output circuit 190.

The parity generation circuit 152 may receive write data, hereinafter, referred to as "test data", which is inputted to a global data bus GIO_N through a data pad DQ_PAD, and may generate a write parity bit PTY_W. The write parity bit PTY_W may be used to correct an error of the test data. An example of the present embodiment may be based on an 8-bit write parity bit PTY_W which is generated for 128-bit test data.

The parity storage circuit 154 may temporarily store the write parity bit PTY_W generated by the parity generation circuit 152 or a read parity bit PTY_R outputted from the parity cell region 110P.

The write circuit 130 may perform a first write operation of writing the test data to first regions 112N and 112P of the normal cell region 110N and the parity cell region 110P, and perform a second write operation of writing the write parity bit PTY_W stored in the parity storage circuit 154 to a second region 114P of the parity cell region 110P. The write circuit 130 may include a normal write driver (WD) 132 corresponding to the normal cell region 110N and a parity write driver (WD_PTY) 134 corresponding to the parity cell region 110P.

The read circuit 140 may perform a first read operation of reading the read parity bit PTY_R from the second region 114P of the parity cell region 110P, and perform a second read operation of reading test data from the first regions 112N and 112P of the normal cell region 110N and the parity cell region 110P. The read circuit 140 may include a normal input/output (I/O) sense amplifier (IOSA) 142 corresponding to the normal cell region 110N and a parity I/O sense amplifier (IOSA_PTY) 144 corresponding to the parity cell region 110P.

The error correction circuit 156 may correct an error of the test data read from the first regions 112N and 112P to the global data bus GIO_N, using the read parity bit PTY_R stored in the parity storage circuit 154, and output error-corrected test data to the global data bus GIO_N.

The test output circuit 190 may compare the error-corrected test data loaded on the global data bus GIO_N with a preset test pattern corresponding to the original test data, and output a 1-bit test result signal indicating a pass/fail to a test pad T_PAD through a test data bus TGIO.

Hereafter, referring to FIGS. 3A to 3D, the test operation for the memory device 100 of FIG. 2 will be described.

FIGS. 3A to 3D are diagrams for describing the test operation of the memory device 100 of FIG. 2.

For reference, during a normal write operation, the parity generation circuit 152 may receive write data inputted to the global data bus GIO_N through the data pad DQ_PAD and generate the write parity bit PTY_W, and the write circuit 130 may write the write data loaded on the global data bus GIO_N to the normal cell region 110N and write the write parity bit PTY_W to the parity cell region 110P. Furthermore, during a normal read operation, the read circuit 140 may read data from the normal cell region 110N, and read a read parity bit PTY_R from the parity cell region 110P. The error correction circuit 156 may correct an error of the data read from the normal cell region 110N using the read parity bit PTY_R read from the parity cell region 110P, and output the error-corrected data to the global data bus GIO_N.

Figure 3A:
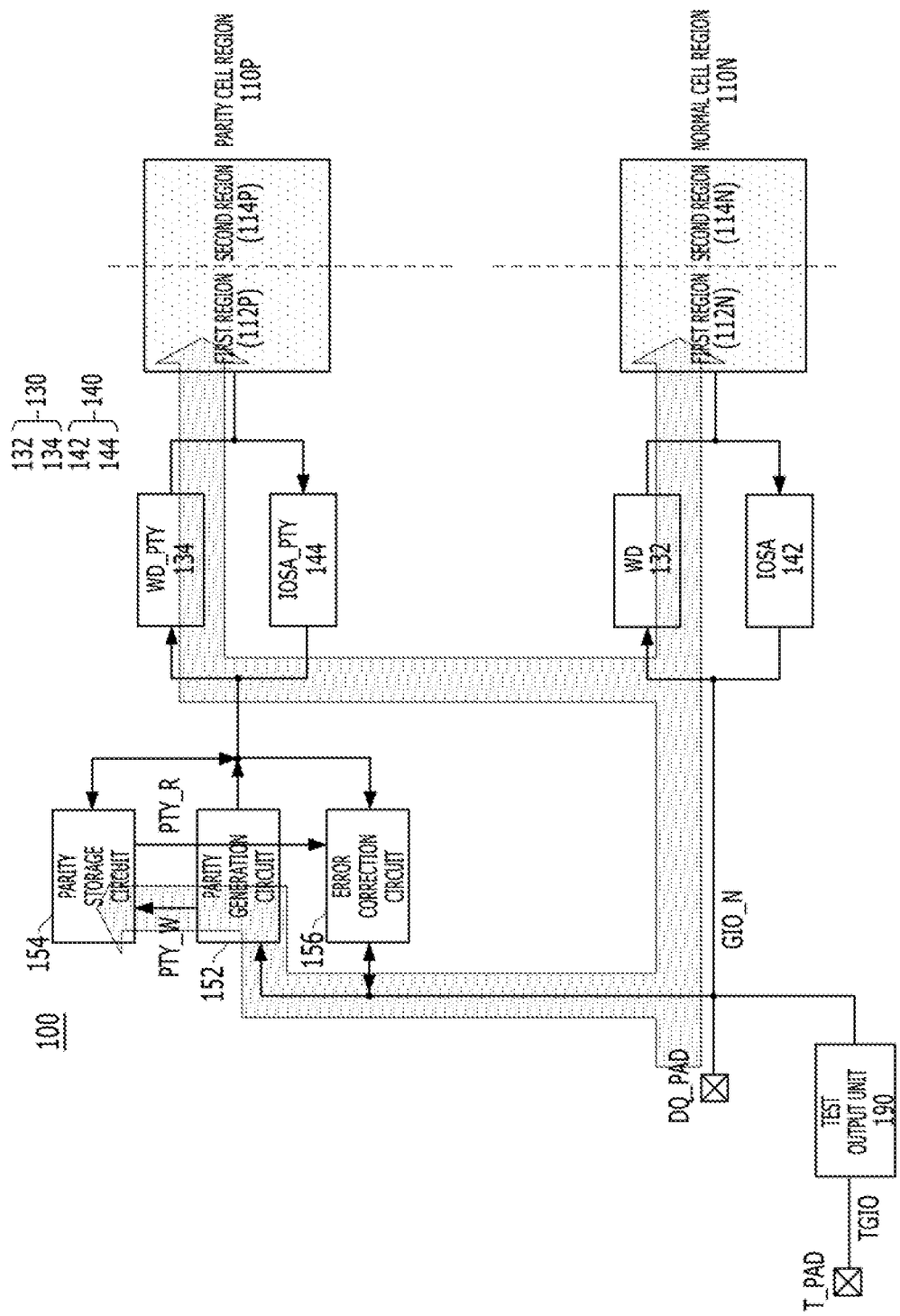

Referring to FIG. 3A, test data may be inputted to the global data bus GIO_N through the data pad DQ_PAD during the test mode.

The normal write driver 132 and the parity write driver 134 of the write circuit 130 may perform the first write operation of writing the test data to the first regions 112N and 112P of the normal cell region 110N and the parity cell region 110P. At this time, the parity generation circuit 152 may receive the test data to generate the write parity bit PTY_W, and the parity storage circuit 154 may temporarily store the write parity bit PTY_W generated by the parity generation circuit 152.

Figure 3B:
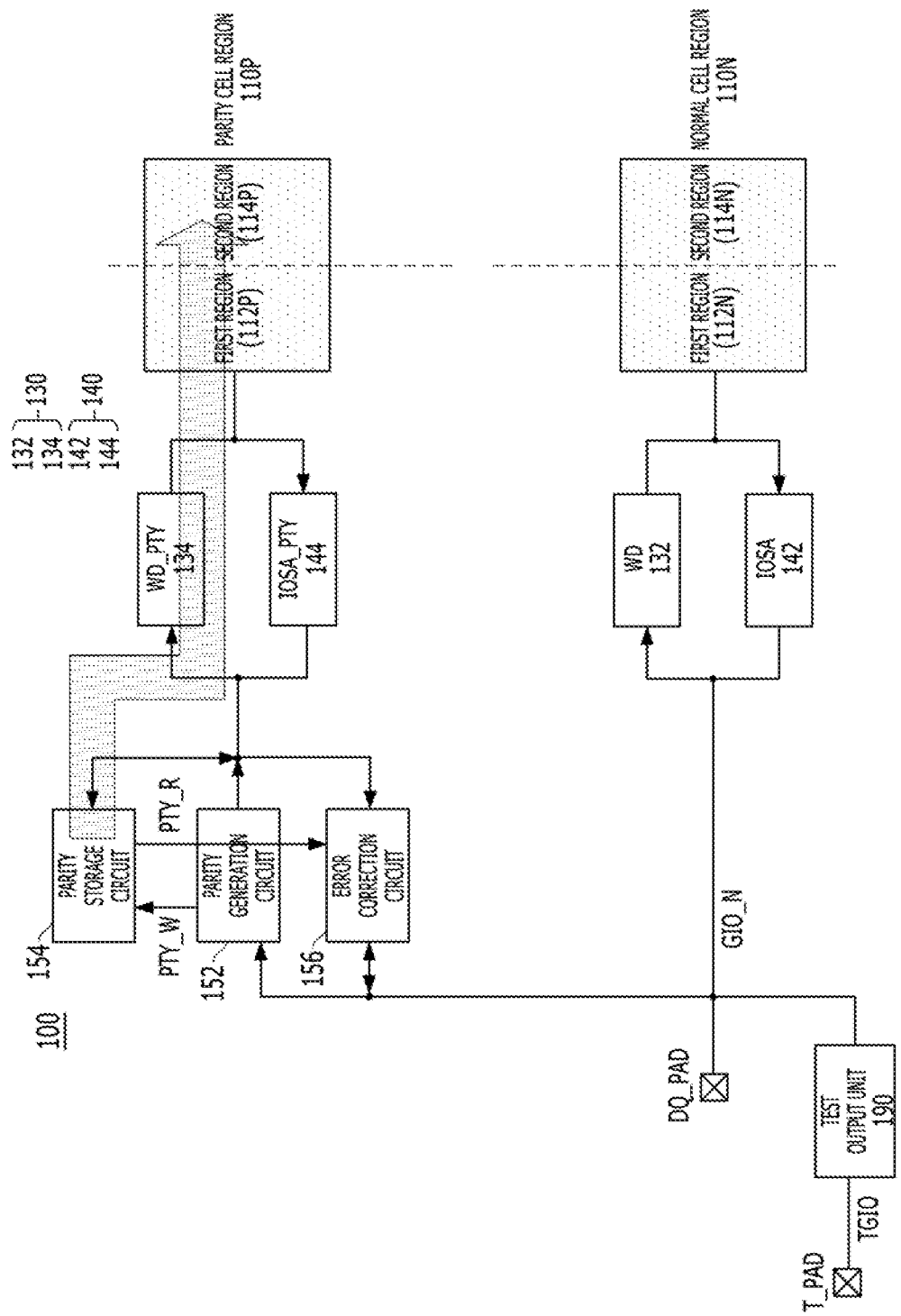

Referring to FIG. 3B, the parity write driver 134 of the write circuit 130 may perform the second write operation of writing the write parity bit PTY_W stored in the parity storage circuit 154 to the second region 114P of the parity cell region 110P. During the second write operation, garbage data may be written to the second region 114N of the normal cell region 110N.

Referring to FIG. 3C, the parity I/O sense amplifier 144 of the read circuit 140 may perform the first read operation of reading the read parity bit PTY_R from the second region 114P of the parity cell region 110P. The parity storage circuit 154 may re-store the read parity bit PTY_R.

Figure 3D:
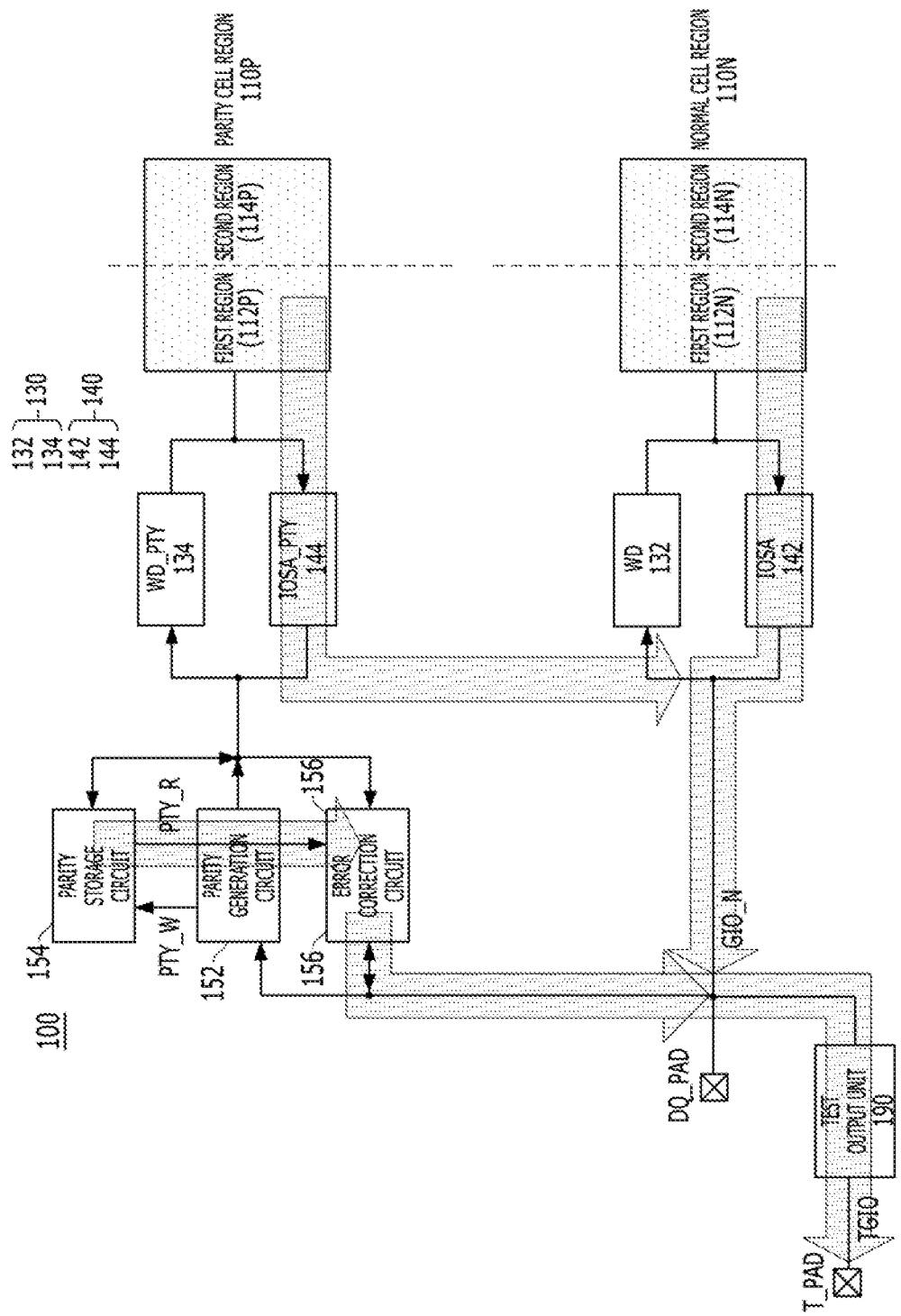

Referring to FIG. 3D, the norm I/O sense amplifier 142 and the parity I/O sense amplifier 144 of the read circuit 140 may perform the second read operation of reading the test data from the first regions 112N and 112P of the normal cell region 110N and the parity cell region 110P. At this time, the error correction circuit 156 may correct an error of the test data read from the first regions 112N and 112P to the global data bus GIO_N using the read parity bit PTY_R restored in the parity storage circuit 154, and output the error-corrected test data to the global data bus GIO_N.

Finally, the test output circuit 190 may compare the error-corrected test data loaded on the global data bus GIO_N with the preset test pattern, and output a 1-bit test result signal indicating a pass/fail to the test data bus TGIO.

As described above, the memory device employing the on-chip ECC scheme in accordance with the present embodiment can test the cell region for storing parity bits for ECC and the normal cell region for storing normal data at the same time, thereby reducing the time required for the test.

Hereafter, an exemplary configuration of the memory device for performing a test operation in accordance with the present embodiment will be described.

Figure 4:
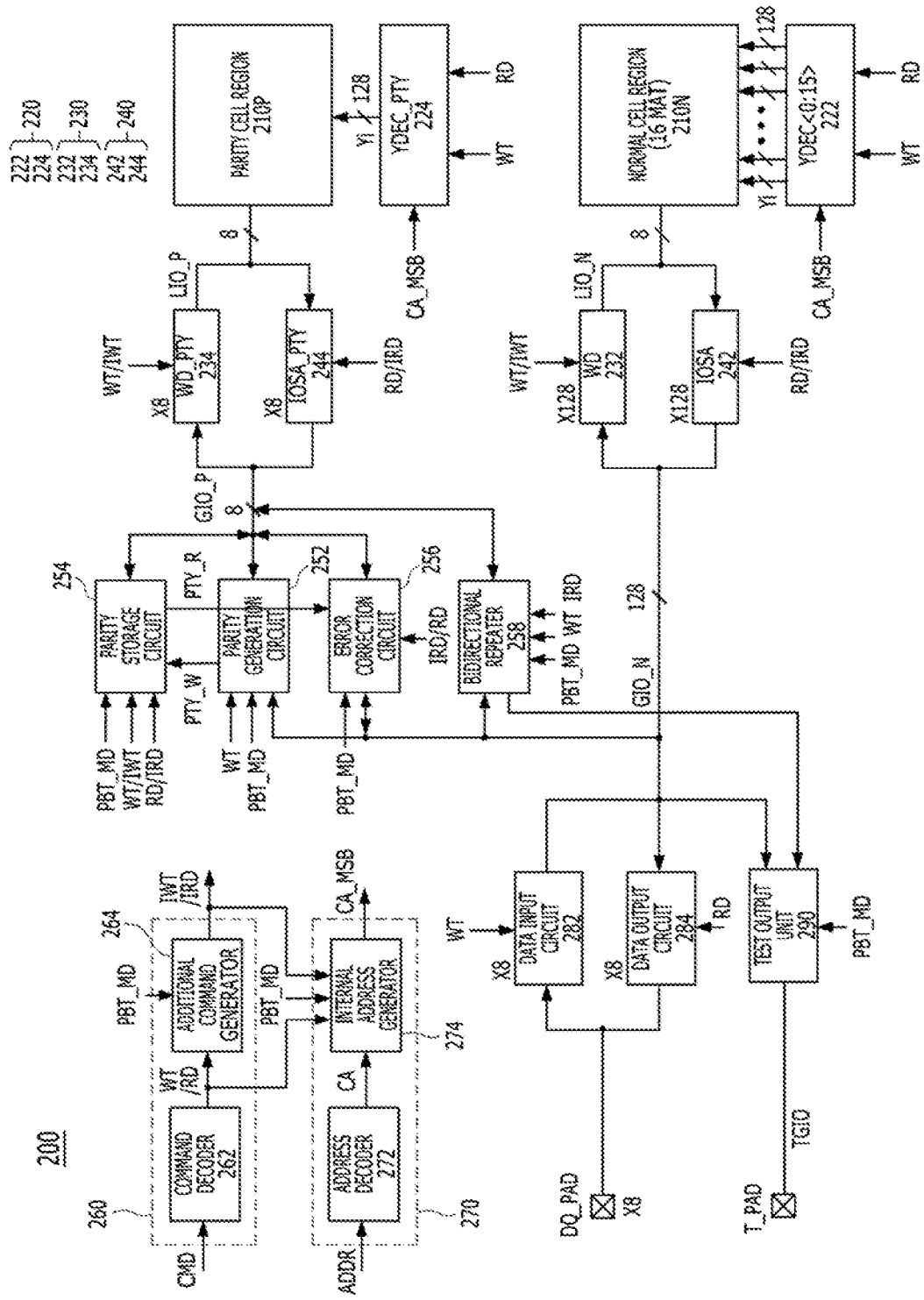
FIG. 4 is a detailed block diagram illustrating a memory device in accordance with an embodiment of the present invention.

FIG. 4 is a detailed block diagram illustrating a memory device 200 in accordance with an embodiment of the present invention.

Referring to FIG. 4, the memory device 200 may include a plurality of data pads DQ_PAD, a test pad T_PAD, a normal cell region 210N, a parity cell region 210P, a column decoding circuit 220, a write circuit 230, a read circuit 240, a parity generation circuit 252, a parity storage circuit 254, an error correction circuit 256, a bidirectional repeater 258, a command control unit 260, an address control unit 270, a plurality of data input circuits 282, a plurality of data output circuits 284 and a test output unit 290.

The command control unit 260 may generate a write command WT or read command RD by decoding a command CMD inputted from outside, and additionally generate an internal write command IWT or internal read command IRD which is activated at a predetermined time after the write command WT or read command RD is generated, during a test mode.

The command control unit 260 may include a command decoder 262 and an additional command generator 264.

The command decoder 262 may generate the write command WT or read command RD by decoding the command CMD. The additional command generator 264 may generate the internal write command IWT which is activated at a predetermined time after the write command WT is generated, or generate the internal read command IRD which is activated at a predetermined time after the read command RD is generated, in response to a test mode signal PBT_MD. For reference, the test mode signal PBT_MD may be activated during the test mode, and deactivated during a normal mode.

During the normal mode, consecutive write commands WT or consecutive read commands RD may be inputted to the memory device 200 at an interval of tCCD (column address strobe (CAS) to CAS command delay), for example, eight clocks. During the test mode, however, the operation may be performed at a lower frequency than the operating frequency of the normal mode. In consideration of such an aspect, the memory device 200 may generate the internal write command IWT which is activated at ½×tCCD, for example, 4 clocks, after the write command WT is generated, and generate the internal read command IRD which is activated at ½×tCCD after the read command RD is generated. In accordance with the present embodiment, since the operating frequency of the test mode is lower than the operating frequency of the normal mode, the operation timing margin can be guaranteed even though an internal command is additionally generated.

The address control unit 270 may generate a column address CA by decoding an address ADDR inputted from outside and output the column address CA as an internal column address CA_MSB. During the test mode, the address control unit 270 may selectively toggle the most significant bit (MSB) of the column address CA according to the write command WT, the read command RD, the internal write command IWT or the internal read command IRD, and output the internal column address CA_MSB.

The address control unit 270 may include an address decoder 272 and an internal address generator 274.

The address decoder 272 may generate the column address CA by buffering the address ADDR. The internal address generator 274 may selectively toggle the MSB of the column address CA according to the write command WT, the read command RD, the internal write command IWT or the internal read command IRD in response to the test mode signal PBT_MD, and output the internal column address CA_MSB. For example, when the test mode signal PBT_MD is activated, the internal address generator 274 may output the column address CA as the internal column address CA_MSB according to the write command WT or the internal read command IRD, or toggle the MSB of the column address CA to output the Internal column address CA_MSB according to the read command RD or the internal write command IWT.

Data inputted through the plurality of data pads DQ_PAD may be referred to as write data, and data outputted through the plurality of data pads DQ_PAD may be referred to as read data. The write data may include normal write data inputted during the normal mode and test write data inputted during the test mode, and the read data may include normal read data outputted during the normal mode and test read data outputted during the test mode. In the following descriptions, data will be referred to as write data and read data, regardless of the normal mode and the test mode.

During the normal mode, write data may be written to the normal cell region 210N, and a parity bit for correcting an error of the write data may be stored in the parity cell region 210P. During the test mode, however, write data may be written to the normal cell region 210N, and the write data and a parity bit for correcting an to error of the write data may be all written to the parity cell region 210P.

The column decoding circuit 220 may include a plurality of normal column decoders (YDEC<0:15>) 222 and a parity column decoder (YDE_PTY) 224. When the normal cell region 210N includes 16 cell mats and the parity cell region 210P includes one cell mat, the column decoding circuit 220 may include 16 normal column decoders 222 and one parity column decoder 224.

When the write command WT or the read command RD is activated, the plurality of normal column decoders 222 and the parity column decoder 224 may activate one of the plurality of column select signals Yi by decoding the internal column address CA_MSB. According to the activated column select signal Yi, data may be inputted/outputted between the normal cell region 210N and a normal local data bus LIO_N and between the parity cell region 210P and a parity local data bus LIO_P.

During the normal mode, write data and read data may be inputted to or outputted from the plurality of data pads DQ_PAD, and during the test mode, write data may be inputted to the plurality of data pads DQ_PAD and read data may be outputted to the test pad T_PAD. FIG. 4 illustrates only one data pad DQ_PAD, but the memory device 200 may include a plurality of data pads DQ_PAD. For convenience of description, an example of a memory device 200 which includes eight data pads DQ_PAD will be referred to.

The plurality of data input circuits 282 may receive the write data inputted from the plurality of data pads DQ_PAD in response to the write command WT. The number of data input circuits 282 may be equal to the number of data pads DQ_PAD. During a write operation, consecutive write data may be serially inputted to the respective data pads DQ_PAD. For example, 16 consecutive write data may be inputted to the respective data pads DQ_PAD. Each of the data input circuits 282 may serial-to-parallel convert the 16 consecutive write data, and transmit the converted write data to the normal global data bus GIO_N. For example, each of the data input circuits 282 may serial-to-parallel convert the write data at 1:16. When each of the eight data input circuits 282 serial-to-parallel converts the write data at 1:16, 128-bit write data may be loaded in parallel onto the normal global data bus GIO_N.

The parity generation circuit 252 may receive the write data loaded on the normal global data bus GIO_N in response to the test mode signal PBT_MD and the write command WT, and generate a writ parity bit PTY_W using the write data. During the normal mode, the parity generation circuit 252 may generate the write parity bit PTY_W using 128-bit write data loaded on the normal global data bus GIO_N, and transmit the write parity bit PTY_W to a parity global data bus GIO_P. During the test mode, however, the parity generation circuit 252 may generate the write parity bit PTY_W using 128-bit write data loaded on the normal global data bus GIO_N and 8-bit write data loaded on the parity global data bus GIO_P, and transmit the write parity bit PTY_W to the parity storage circuit 254. As an example, the present embodiment may be based on a parity generation circuit 152 which generates an 8-bit write parity bit PTY_W for 128-bit write data or 136 (128+8)-bit write data.

The parity storage circuit 254 may temporarily store the write parity bit PTY_W generated by the parity generation circuit 252 or a read parity bit PTY_R outputted from the parity cell region 210P, in response to the test mode signal PBT_MD. During the test mode, the parity storage circuit 254 may store the write parity bit PTY_W according to the write command WT, and transmit the stored write parity bit PTY_W to the parity global data bus GIO_P according to the internal write command IWT. Furthermore, during the test mode, the parity storage circuit 254 may store the read parity bit PTY_R transmitted to the parity global data bus GIO_P from the parity cell region 210P according to the read command RD, and transmit the stored read parity bit PTY_R to the error correction circuit 256 according to the internal read command IRD.

The bidirectional repeater 258 may transmit data of the normal global data bus GIO_N to the parity global data bus GIO_P, and transmit data of the parity global data bus GIO_P to the test output unit 290, in response to the test mode signal PBT_MD, the write command WT and the internal read command IRD. When the test mode signal PBT_MD is activated, the bidirectional repeater 258 may copy a part, for example, 8 bits, of the 128-bit write data loaded on the normal global data bus GIO_N, to the parity global data bus GIO_P according to the write command WT, and transmit the data loaded on the parity global data bus GIO_P to the test output unit 290 according to the internal read command IRD.

The write circuit 230 may include a plurality of normal write drivers (WD) 232 and a plurality of parity write drivers (WD_PTY) 234. At this time, when 128-bit write data are loaded in parallel on the normal global data bus GIO_N, 128-bit normal write drivers 232 and eight parity write drivers 234 may be provided.

The plurality of normal write drivers 232 may write the write data transmitted through the normal global data bus GIO_N to the normal cell region 210N in response to the write command WT or the internal write command IWT. The data transmission between the plurality of normal write drivers 232 and the normal cell region 210N may be performed through the normal local data bus LIO_N.

The plurality of parity write drivers 234 may write the data transmitted through the parity global data bus GIO_P to the parity cell region 210P in response to the write command WT or the internal write command IWT. At this time, the data transmitted through the parity global data bus GIO_P may include the write parity bit PTY_W outputted from the parity generation circuit 252 during the normal mode, and the write parity bit PTY_W transmitted from the parity storage circuit 254 or the write data transmitted from the bidirectional repeater 258 during the test mode. The data transmission between the plurality of parity write drivers 234 and the parity cell region 210P may be performed through the parity local data bus LIO_P.

The read circuit 240 may include a plurality of normal I/O sense amplifiers (IOSA) 242 and a plurality of parity I/O sense amplifiers (IOSA_PTY) 244. At this time, when 128-bit read data are loaded in parallel on the normal global data bus GIO_N, 128-bit normal I/O sense amplifiers 242 and eight parity I/O sense amplifiers 244 may be provided.

The plurality of normal I/O sense amplifiers 242 may transmit data read from the normal cell region 210N to the normal global data bus GIO_N in response to the read command RD or the internal read command IRD. The data transmission between the plurality of normal I/O sense amplifiers 242 and the normal cell region 210N may be performed through the normal local data bus LIO_N.

The plurality of parity I/O sense amplifiers 244 may transmit data read from the parity cell region 210N to the parity global data bus GIO_P in response to the read command RD or the internal read command IRD. At this time, the data read from the parity cell region 210P may include the read parity bit PTY_R during the normal mode and the read parity bit PTY_R or the read data during the test mode. The data transmission between the plurality of parity I/O sense amplifiers 244 and the parity cell region 210P may be performed through the parity local data bus LIO_P.

The error correction circuit 256 may correct an error of the read data using the read parity bit PTY_R inputted thereto, in response to the test mode signal PBT_MD, the read command RD and the internal read command IRD. During the normal mode, the error correction circuit 256 may correct an error of the 128-bit read data loaded on the normal global data bus GIO_N, using the 8-bit read parity bit PTY_R transmitted to the parity global data bus GIO_P from the parity cell region 210P, in response to the read command RD. During the test mode, however, the error correction circuit 256 may correct an error of the 136(=128+8)-bit read data loaded on the parity global data bus GIO_P and the normal global data bus GIO_N, using the 8-bit read parity bit PTY_R transmitted from the parity storage circuit 254, in response to the internal read command IRD.

The plurality of data output circuits 284 may transmit the error-corrected read data to the outside of the memory device 100 through the plurality of data pads DQ_PAD in response to the read command RD. The number of data output circuits 284 may be equal to the number of data pads DQ_PAD. When each of the eight data output circuit 284 parallel-to-serial converts the 128-bit read data loaded on the normal global data bus GIO_N at 16:1, 16-bit read data may be serially outputted to each of the 8-bit data pads DQ_PAD.

The test output circuit 290 may receive the error-corrected 128-bit read data loaded on the global data bus GIO_N and the error-corrected 8-bit read data loaded on the parity global data bus GIO_P and transmitted from the bidirectional repeater 258, compare the 136-bit read data with a preset test pattern, and output a 1-bit test result signal indicating a pass/fail to a test data bus TGIO, in response to the test mode signal PBT_MD.

Figure 5:
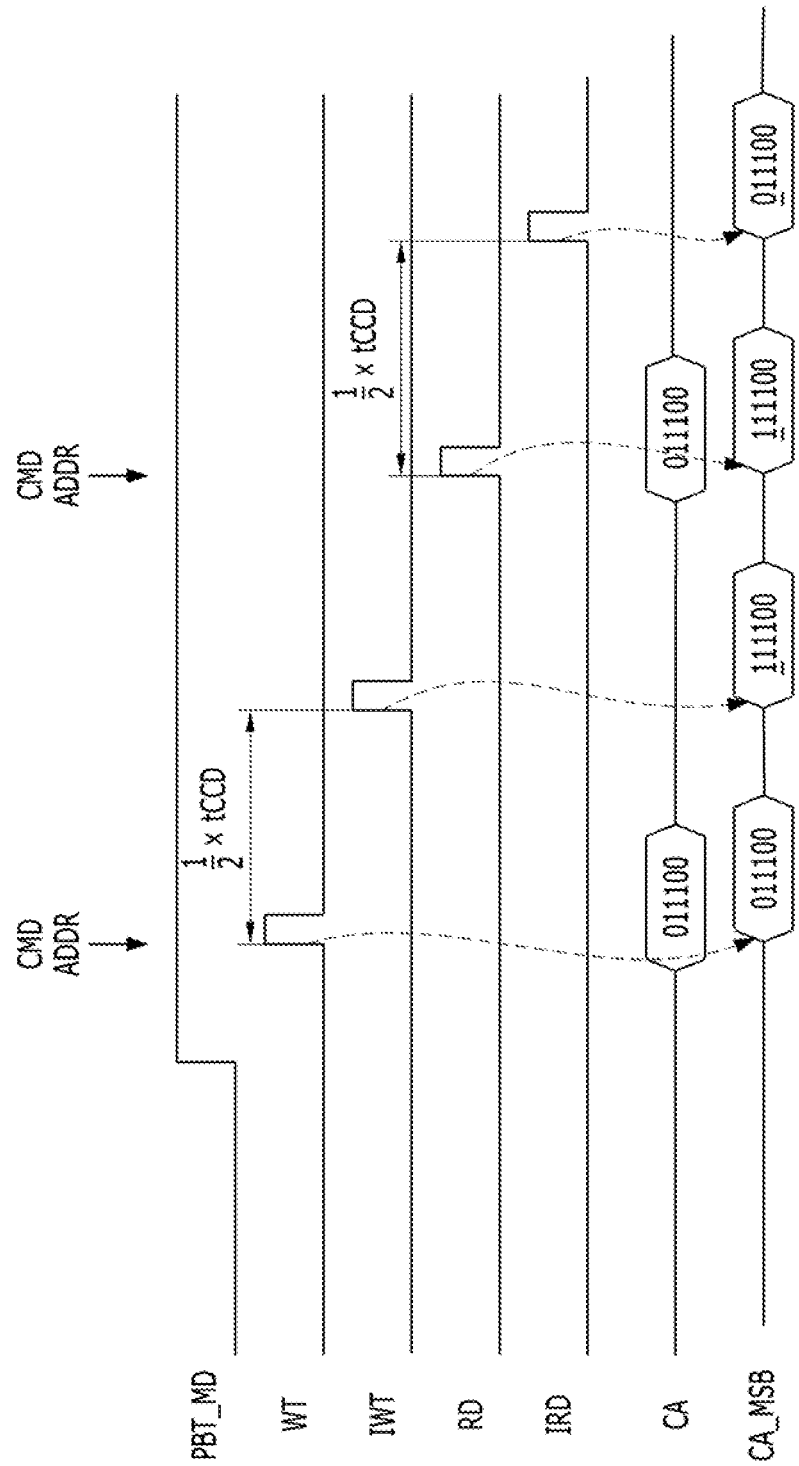
FIG. 5 is a timing diagram for describing operations of a command control unit and an address control unit shown in FIG. 4.

FIG. 5 is a timing diagram for describing operations of the command control unit 260 and the address control unit 270 of FIG. 4.

Referring to FIG. 5, the test mode signal PBT_MD may be activated when entering the test mode.

The command decoder 262 may generate the write command WT by decoding the command CMD. The address decoder 272 may generate the column address CA of "011100" by decoding the address ADDR.

The additional command generator 264 may generate the internal write command IWT which is activated at a predetermined time after the write command WT is generated. At this time, the predetermined time may be set to ½xtCCD.

The internal address generator 274 may output the internal column address CA_MSB having the same value of "011100" as the column address CA according to the write command WT, and output the internal column address CA_MSB of "111100" by toggling the MSB of the column address CA according to the internal write command IWT.

Then, the command decoder 262 may generate the read command RD by decoding the command CMD. The address decoder 272 may generate the column address CA of "011100" by decoding the address ADDR.

The additional command generator 264 may generate the internal read command IRD which is activated at a predetermined time after the read command RD is generated. At this time, the predetermined time may be set to ½xtCCD.

The internal address generator 274 may output the internal column address CA_MSB of "111100" by toggling the MSB of the column address CA according to the read command RD, and output the internal column address CA_MSB having the same value of "011100" as the column address CA according to the internal read command IRD.

Therefore, during the test mode, the memory device in accordance with the present embodiment may first select the first regions (not illustrated) of the normal cell region 210N and the parity cell region 210P to perform a first write operation according to the internal column address CA_MSB having the same value as the column address CA, and then select the second regions (not illustrated) of the normal cell region 210N and the parity cell region 210P to perform a second write operation according to the internal column address CA_MSB whose MSB is toggled from the internal column address CA. After that, the memory device may select the second regions of the normal cell region 210N and the parity cell region 210P to perform a first read operation according to the internal column address CA_MSB whose MSB is toggled from the internal column address CA, and select the first regions of the normal cell region 210N and the parity cell region 210P to perform a second read operation according to the internal column address CA_MSB having the same value as the column address CA.

Figure 6:
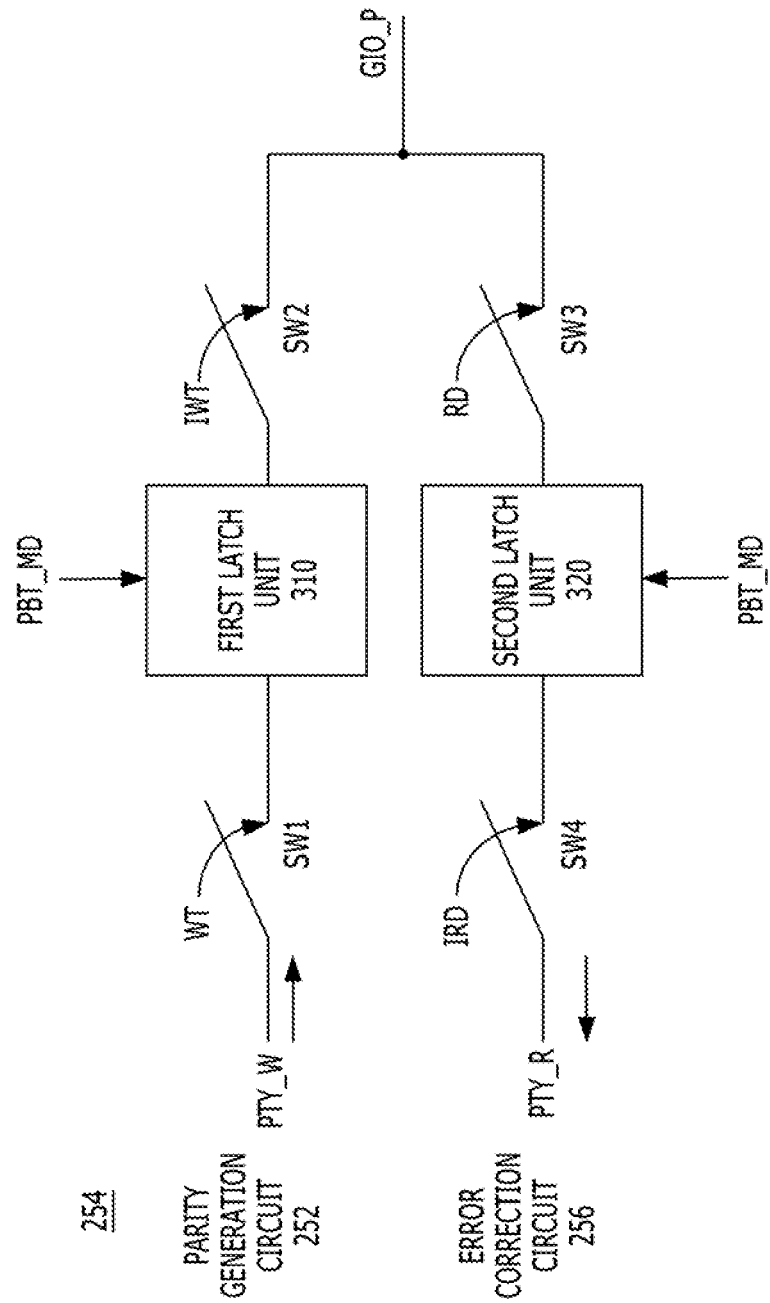
FIG. 6 is a detailed block diagram illustrating a parity storage circuit shown in FIG. 4.

FIG. 6 is a detailed block diagram illustrating the parity storage circuit 254 of FIG. 4.

Referring to FIG. 6, the parity storage circuit 254 may include first to fourth switches SW1 to SW4, a first latch unit 310 and a second latch unit 320.

The first switch SW1 may be coupled between the parity generation circuit 252 and the first latch unit 310, and turned on according to the write command WT. The first switch SW1 may transmit the write parity bit PTY_W from the parity generation circuit 252 to the first latch unit 310 in response to the write command WT.

The first and second latch units 310 and 320 may be enabled in response to the test mode signal PBT_MD, and store the data inputted thereto. The first and second latch units 310 and 320 may be implemented with an 8-bit register.

The second switch SW2 may be coupled between the first latch unit 310 and the parity global data bus GIO_P, and turned on according to the internal write command IWT. The second switch SW2 may transmit the write parity bit PTY_W stored in the first latch unit 310 to the parity global data bus GIO_P in response to the internal write command IWT.

The third switch SW3 may be coupled between the parity global data bus GIO_P and the second latch unit 320, and turned on according to the read command RD. The third switch SW3 may receive the read parity bit PTY_R outputted to the parity global data bus GIO_P from the parity cell region (210P of FIG. 4) and transmit the read parity bit PTY_R to the second latch unit 320, in response to the read command RD.

The fourth switch SW4 may be coupled between the second latch unit 320 and the error correction circuit 256, and turned on according to the internal read command IRD. The fourth switch SW4 may transmit the read parity bit PTY_R stored in the second latch unit 320 to the error correction circuit 256 in response to the internal read command IRD.

As described above, the parity storage circuit 254 may temporarily store the write parity bit PTY_W generated by the parity generation circuit 252 and transmit the stored write parity bit PTY_W to the parity global data bus GIO_P, in response to the test mode signal PBT_MD. Furthermore, the parity storage circuit 254 may temporarily store the read parity bit PTY_R outputted from the parity cell region 210P and transmit the stored read parity bit PTY_R to the error correction circuit 256, in response to the test mode signal PBT_MD.

Hereafter, referring to FIGS. 4 to 10B, a test operation of the memory device in accordance with a present embodiment will be described. The test operation may include a write operation for writing a specific test pattern to a plurality of memory cells and a read operation for reading stored data from the plurality of memory cells.

Figure 7:
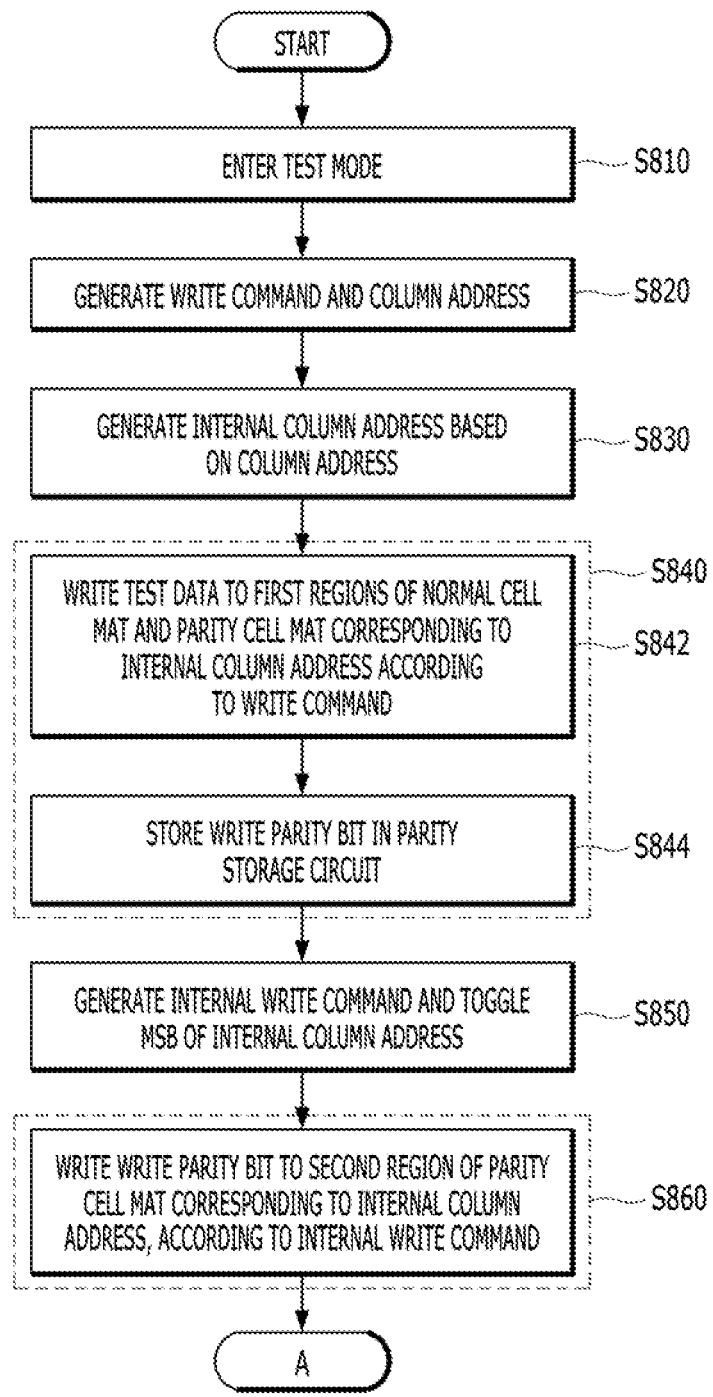
FIG. 7 is a flowchart for describing a write operation during a test operation of a memory device in accordance with an embodiment of the present invention.
Figure 8A:
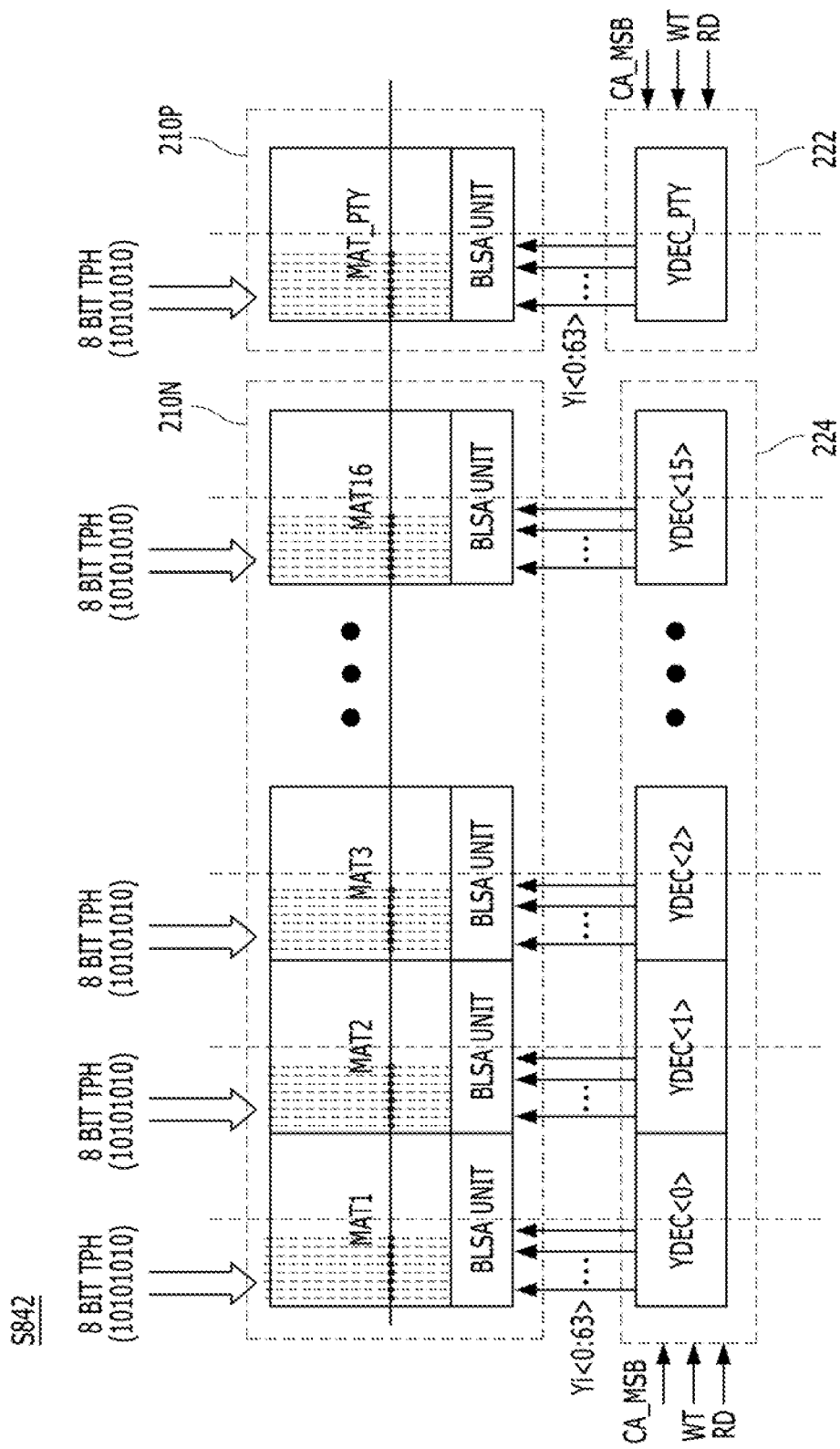

FIG. 7 is a flowchart for describing a write operation during a test operation of a memory device in accordance with an embodiment of the present invention, FIGS. 8A and 8B are diagrams for describing steps S842 and S860 in FIG. 7.

Referring to FIG. 7, the test mode signal PBT_MD may be activated when entering the test mode, at step S810.

The command decoder 262 may generate the write command WT by decoding the command CMD, and the address decoder 272 may generate the column address CA of "011100" by decoding the address ADDR, at step S820.

The internal address generator 274 may generate the internal column address CA_MSB of "011100" based on the column address CA, according to the write command WT, at step S830.

The memory device 200 may perform the first write operation of writing test data to the first regions (not illustrated) of the normal cell region 210N and the parity cell region 210P corresponding to the internal column address CA_MSB according to the write command WT, and store the write parity bit PTY_W generated based on the test data to the parity storage circuit 254, at step S840.

More specifically, the plurality of data input circuits 282 may receive the test data inputted to the plurality of data pads DQ_PAD and transmit the test data to the normal global data bus GIO_N, in response to the write command WT.

The plurality of normal write drivers 232 may write the test data transmitted through the normal global data bus GIO_N to the normal cell region 210N in response to the write command WT. The bidirectional repeater 258 may copy eight bits of the 128-bit test data loaded on the normal global data bus GIO_N to the parity global data bus GIO_P according to the write command WT, and the plurality of parity write drivers 234 may write the test data transmitted through the parity global data bus GIO_P to the parity cell region 210P in response to the write command WT.

At this time, since the MSB of the internal column address CA_MSB is set to '0', the plurality of normal column decoders 222 and the parity column decoder 224 may activate one of the lower half of the 128 column select signals Yi<0:127>, that is, 64 column select signals Yi<0:63>. Therefore, as illustrated in FIG. 8A, the test data TPH of "10101010", for example, may be written to the first regions of the normal cell region 210N and the parity cell region 210P, which correspond to the lower half Yi<0:63> of the column select signals Yi<0:127>, at step S842.

Simultaneously, the parity generation circuit 252 may generate the 8-bit write parity bit PTY_W using the 128-bit test data loaded on the normal global data bus GIO_N and the 8-bit test data loaded on the parity global data bus GIO_P, and transmit the write parity bit PTY_W to the parity storage circuit 254, in response to the write command WT. The parity storage circuit 254 may temporarily store the write parity bit PTY_W in the first latch unit 310 according to the write command WT, at step S844.

Then, the additional command generator 264 may generate an internal write command IWT which is activated at a predetermined time after the write command WT is generated, and the internal address generator 274 may toggle the MSB of the internal column address CA_MSB that is, toggle the MSB of the column address CA to output the internal column address CA_MSB of "111100" according to the internal write command IWT, at step S850.

The parity storage circuit 254 may transmit the write parity bit PTY_W stored in the first latch unit 310 to the parity global data bus GIO_P according to the internal write command IWT, and the plurality of parity write drivers 234 may perform the second write operation of writing the write parity bit PTY_W transmitted through the parity global data bus GIO_P to the parity cell region 210P in response to the internal write command IWT, at step S860.

At this time, since the MSB of the internal column address CA_MSB is set to '1', the plurality of normal column decoders 222 and the parity column decoder 224 may activate one of the upper half of the 128 column select signals Yi<0:127>, that is, 64 column select signals Yi<64:127>. Therefore, as illustrated in FIG. 8B, the test data may be written to the second regions of the normal cell region 210N and the parity cell region 210P, which correspond to the upper half Yi<64:127> of the column select signals Yi<0:127>. At this time, garbage data may be written to the second region of the normal cell region 210N.

By repeating the above-described process, the memory device 200 may write the desired test data to the first regions of the normal cell region 210N and the parity cell region 210P, and write the parity bit for the test data to the second region of the parity cell region 210P.

Figure 9:
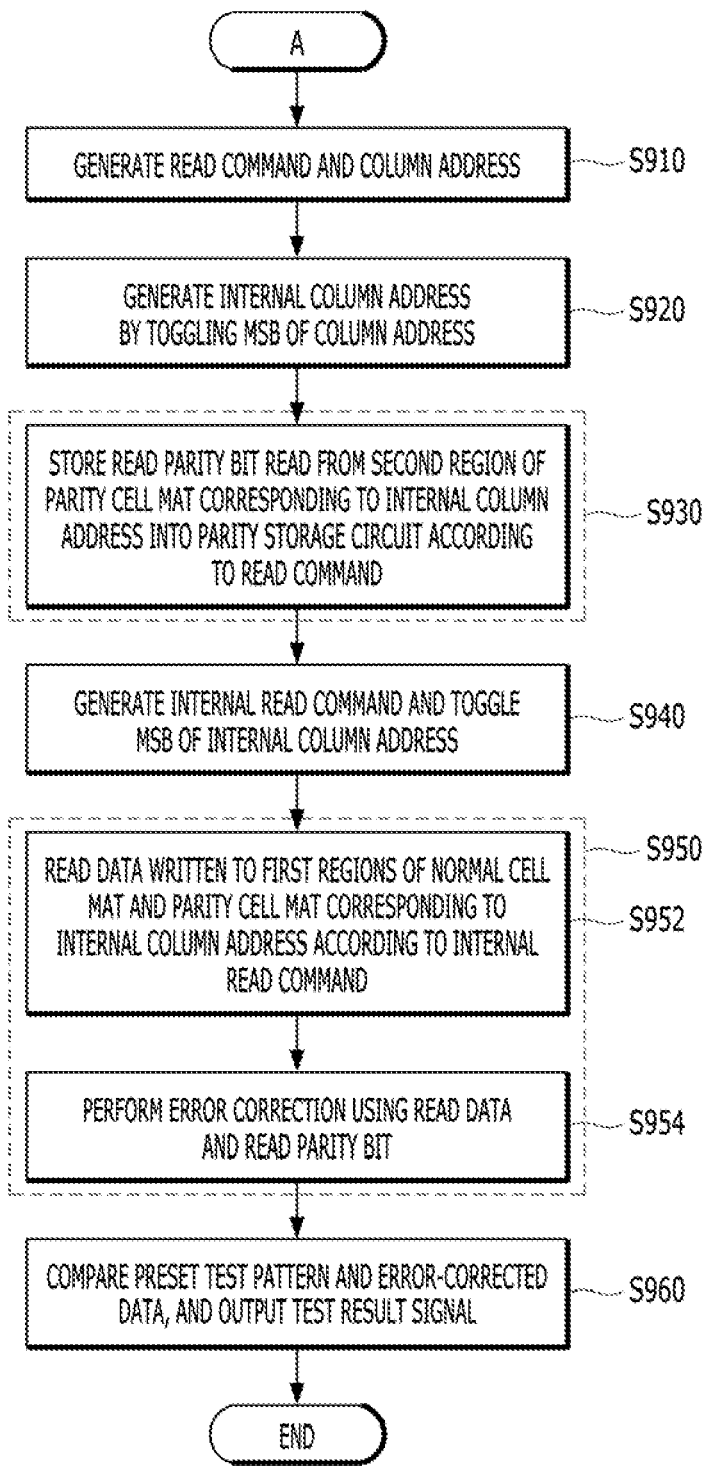
FIG. 9 is a flowchart for describing a read operation during a test operation of a memory device in accordance with an embodiment of the present invention.
Figure 10A:
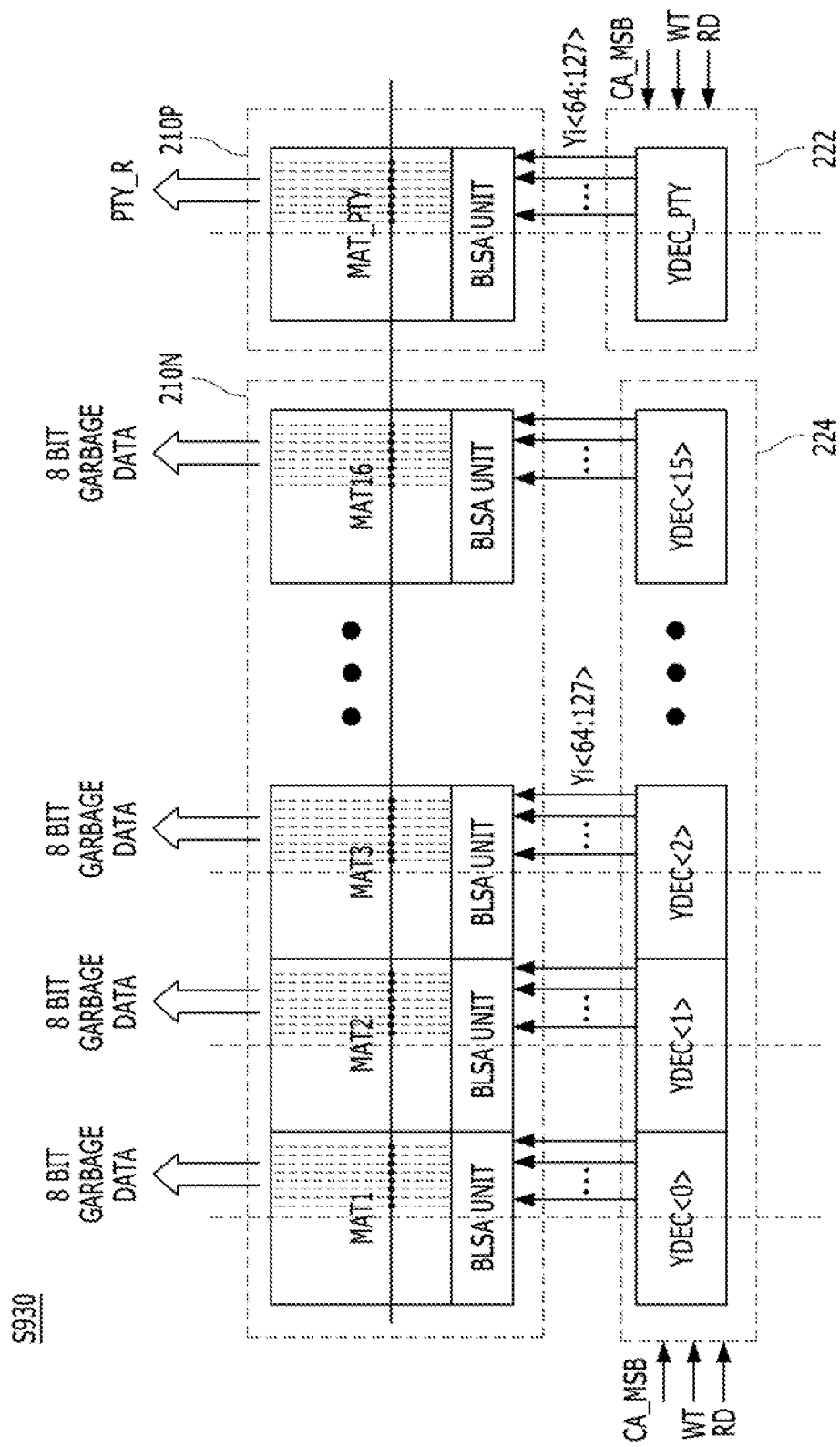
FIGS. 10A and 10B are diagrams describing the steps shown in FIG. 9.
Figure 10B:
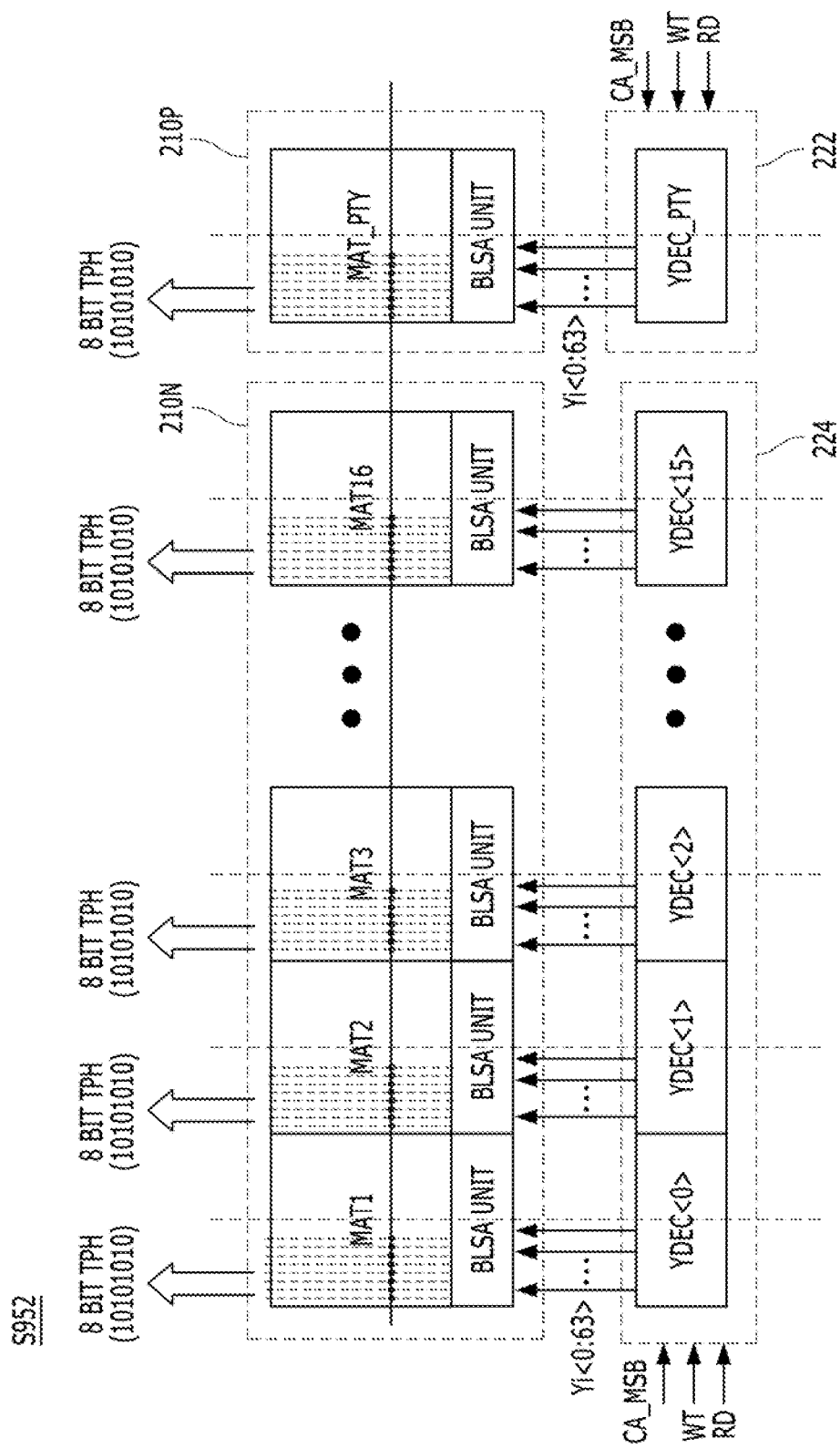

FIG. 9 is a flowchart for describing a read operation during a test operation of a memory device in accordance with an embodiment of the present invention. FIGS. 10A and 10B are diagrams for describing steps S930 and S952 in FIG. 9.

Referring to FIG. 9, the command decoder 262 may generate the read command RD by decoding the command CMD, and the address decoder 272 may generate the column address CA of "011100" by decoding the address ADDR, at step S910.

The internal address generator 274 may generate the internal column address CA_MSB of "111100" by toggling the MSB of the column address CA according to the read command RD, at step S920.

The plurality of parity I/O sense amplifiers 244 may perform the first read operation of reading the read parity bit PTY_R from the second region of the parity cell region 210P corresponding to the internal column address CA_MSB, and storing the read parity bit PTY_R into the parity storage circuit 254, according to the read command RD, at step S930. At this time, since the MSB of the internal column address CA_MSB is, set to '1', the plurality of normal column decoders 222 and the parity column decoder 224 may activate one of the upper half of the 128 column select signals Yi<0:127>, that is, 64 column select signals Yi<64:127>. Therefore, as illustrated in FIG. 10A, the read parity bit PTY_R may be read from the second region of the parity cell region 210P, which corresponds to the upper half Yi<64:127> of the column select signals Yi<0:127>. Garbage data stored in the second region of the normal cell region 210N may be outputted at the same time. The parity storage circuit 254 may re-store the read parity bit PTY_R which is read according to the read command RD.

Then, the additional command generator 264 may generate the it read command IRD which is activated at a predetermined time after the read command RD is generated, and the internal address generator 274 may output the internal column address CA_MSB of "011100" having the same value of "011100" as the column address CA by toggling the MSB of the internal column address CA_MSB according to the internal read command IRD, at step S940.

The memory device 200 may perform the second read operation of reading the test data stored in the first regions of the normal cell region 210N and the parity cell region 210P, which correspond to the internal column address CA_MSB, according to the internal read command IRD, at step S950.

More specifically, the plurality of normal I/O sense amplifiers 242 may transmit the test data read from the normal cell region 210N to the normal global data bus GIO_N in response to the internal read command IRD. The plurality of parity I/O sense amplifiers 244 may transmit the test data read from the parity cell region 210P to the parity global data bus GIO_P in response to the internal read command IRD.

At this time, since the MSB of the internal column address CA_MSB is set to '0', the plurality of normal column decoders 222 and the parity column decoder 224 may activate one of the lower half of the 128 column select signals Yi<0:127>, that is, 64 column select signals Yi<0:63>. Therefore, as illustrated in FIG. 10B, the test data TPH may be read from the first regions of the normal cell region 210N and the parity cell region 210P, which correspond to the lower half Yi<0:63> of the column select signals Yi<0:127>, at step S952.

The error correction circuit 256 may correct an error of 136(=128+8)-bit read data loaded on the parity global data bus GIO_P and the normal global data bus GIO_N, using the 8-bit read parity bit PTY_R transmitted from the parity storage circuit 254, in response to the internal read command IRD, at step S954. Then, the bidirectional repeater 258 may transmit the data loaded on the parity global data bus GIO_P to the test output unit 290 according to the internal read command IRD.

The test output circuit 290 may receive the error-corrected 128-bit read data loaded on the global data bus GIO_N and the error-corrected 8-bit read data loaded on the parity global data bus GIO_P and transmitted from the bidirectional repeater 258, compare the 136-bit read data with the preset test pattern, and output the 1-bit test result signal indicating a pass/fail to the test data bus TGIO, at step S960.

By repeating the above-described process the memory device may correct an error of the test data read from the second regions of the normal cell region 210N and the parity cell region 210P using the parity bit read from the second region of the parity cell region 210P, and output the test result after comparing the error-corrected read data with the preset test pattern.

In accordance with the present embodiments, a memory device employing an on-chip ECC scheme can test a parity cell region for storing parity bits and a normal cell region for storing normal data in parallel, thereby reducing the test time.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:

1. A test method for a memory device, comprising:
performing a first write operation of writing test data provided from an external device to first regions of a normal cell region and a parity cell region, and storing parity bits generated based on the test data in a temporary storage circuit;
performing a second write operation of writing the parity bits stored in the temporary storage circuit to a second region of the parity cell region, wherein the parity cell region stores both of the test data and the parity bits after the second write operation;
performing a first read operation of reading the parity bits from the second region of the parity cell region, and storing the parity bits into the temporary storage circuit; and
performing a second read operation of reading the test data from the first regions of the normal cell region and the parity cell region, correcting an error of the test data using the parity bits stored in the temporary storage circuit, and outputting error-corrected test data.

2. The test method of claim 1, further comprising:
receiving a write command and an external address; and
generating a first internal address based on the external address,
wherein the first write operation is performed according to the write command and the first internal address.

3. The test method of claim 2, further comprising:
generating an internal write command which is activated at a predetermined time after the write command is inputted; and
generating a second internal address by toggling a most significant bit (MSB) of the first internal address in response to the internal write command,
wherein the second write operation is performed according to the internal write command and the second internal address.

4. The test method of claim 3, wherein the predetermined time is set to ½*tCCD (column address strobe (CAS) to CAS Command Delay).

5. The test method of claim 2, further comprising:
receiving a read command and the external address; and
generating a third internal address by toggling a most significant bit (MSB) of the external address,
wherein the first read operation is performed according to the read command and the third internal address.

6. The test method of claim 5, further comprising:
generating an internal read command which is activated at a predetermined time after the read command is inputted; and
generating a fourth internal address by toggling an MSB of the third internal address,
wherein the second read operation is performed according to the internal read command and the fourth internal address.

7. The test method of claim 6, wherein the predetermined time is set to ½*tCCD.

8. The test method of claim 1, wherein, during the second write operation, garbage data are written to a second region of the normal cell region.

9. The test method of claim 1, after the second read operation, further comprising:
comparing the error-corrected test data with a preset test pattern and outputting a comparison result.

10. A memory device comprising:
a normal cell region and a parity cell region;
a parity storage circuit suitable for temporarily storing write parity bits and read parity bits;
a write circuit suitable for writing test data provided from an external device to first regions of the normal cell region and the parity cell region, and writing the write parity bits stored in the parity storage circuit to a second region of the parity cell region, wherein the parity cell region stores both of the test data and the parity bits after writing;
a read circuit suitable for reading parity bits from the second region of the parity cell region to provide the read parity bits to the parity storage circuit, and reading the test data from the first regions of the normal cell region and the parity cell region; and
an error correction circuit suitable for correcting an error of the test data read from the first regions of the normal cell region and the parity cell region, using the read parity bits stored in the parity storage circuit.

11. The memory device of claim 10, further comprising:
an additional command generator circuit suitable for generating an internal write command which is activated at a predetermined time after a write command is inputted; and
an internal address generator circuit suitable for generating a first internal address using an external address in response to the write command, and generating a second internal address by toggling a most significant bit (MSB) of the first internal address in response to the internal write command.

12. The memory device of claim 11, wherein the write circuit writes the test data to the first regions of the normal cell region and the parity cell region, which correspond to the first internal address in response to the write command, and writes the write parity bits to the second region of the parity cell region, which corresponds to the second internal address in response to the internal write command.

13. The memory device of claim 10, further comprising:
an additional command generator circuit suitable for generating an internal read command which is activated at a predetermined time after a read command is inputted; and
an internal address generator circuit suitable for generating a third internal address by toggling a most significant bit (MSB) of an external address in response to the read command, and generating a fourth internal address by toggling an MSB of the third internal address in response to the internal read command.

14. The memory device of claim 13, wherein the read circuit reads the read parity bits from the second region of the parity cell region, which corresponds to the third internal address in response to the read command, and reads the test data from the first regions of the normal cell region and the parity cell region, which correspond to the fourth internal address in response to the internal read command.

15. The memory device of claim 10, further comprising:
a test output circuit suitable for comparing error-corrected test data outputted from the error correction circuit with a preset test pattern, and outputting a comparison result.

16. A memory device comprising:
a normal cell region and a parity cell region;
an additional command generator circuit suitable for generating an internal read command or an internal write command which is activated at a predetermined time after a read command or a write command is inputted;
a parity generation circuit suitable for generating parity bits for test data provided from an external device in response to the write command;
a parity storage circuit suitable for storing the parity bits in response to the read command or the write command, and outputting the stored parity bits in response to the internal read command or the internal write command;
a write circuit suitable for writing the test data to first regions of the normal cell region and the parity cell region according to the write command, and writing the parity bits stored in the parity storage circuit to a second region of the parity cell region according to the internal write command, wherein the parity cell region stores both of the test data and the parity bits after writing;
a read circuit suitable for reading the parity bits from the second region of the parity cell region according to the read command, and reading the test data from the first regions of the normal cell region and the parity cell region according to the internal read command; and an error correction circuit suitable for correcting an error of the test data read from the first regions of the normal cell region and the parity cell region, using the parity bits stored in the parity storage circuit.

17. The memory device of claim 16, further comprising:
an internal address generator circuit suitable for
generating a first internal address based on an external address in response to the write command, and generating a second internal address by toggling a most significant bit (MSB) of the first internal address in response to the internal write command; and
generating a third internal address by toggling an MSB of the external address in response to the read command, and generating a fourth internal address by toggling an MSB of the third internal address in response to the internal read command.

18. The memory device of claim 17, wherein the write circuit writes the test data to the first regions of the normal cell region and the parity cell region, which correspond to the first internal address in response to the write command, and writes the parity bits to the second region of the parity cell region, which corresponds to the second internal address in response to the internal write command.

19. The memory device of claim 17, wherein the read circuit reads the parity bits from the second region of the parity cell region, which corresponds to the third internal address in response to the read command, and reads the test data from the first regions of the normal cell region and the parity cell region, which correspond to the fourth internal address in response to the internal read command.

20. The memory device of claim 16, further comprising:
a test output circuit suitable for comparing error-corrected test data outputted from the error correction circuit with a preset test pattern, and outputting a comparison result.

* * * * *